United States Patent [19]

Sako

[11] Patent Number: 4,942,456

[45] Date of Patent: Jul. 17, 1990

[54] PLASTIC PACKAGED DEVICE HAVING A HOLLOW PORTION ENCLOSING A CHIP ELEMENT

[75] Inventor: Shigeki Sako, Kawagawa, Japan

[73] Assignee: Kabushiki Kaisha Toshiba, Kawasaki, Japan

[21] Appl. No.: 235,455

[22] Filed: Aug. 22, 1988

[30] Foreign Application Priority Data

Aug. 28, 1987 [JP] Japan ................... 62-214319

[51] Int. Cl.$^5$ ............................ H01L 23/02
[52] U.S. Cl. ......................... 357/72; 357/74
[58] Field of Search .............. 357/72, 74, 81

[56] References Cited

U.S. PATENT DOCUMENTS 4,054,901 10/1977 Edwards et al. ............... 357/72
4,697,203 9/1987 Sakai et al. .................... 357/74
4,717,948 1/1988 Sakai et al. .................... 357/74

Primary Examiner—James W. Davie
Attorney, Agent, or Firm—Oblon, Spivak, McClelland, Maier & Neustadt

[57] ABSTRACT

A plastic packaged device comprises a chip element mounted on a supporting member, and covered by a hollow portion. The supporting member has a wall portion at least partially surrounding the chip element. As the hollow portion ends at the wall portion, sufficient space for covering the chip element is achieved.

10 Claims, 3 Drawing Sheets

PLASTIC PACKAGED DEVICE HAVING A HOLLOW PORTION ENCLOSING A CHIP ELEMENT

BACKGROUND OF THE INVENTION

1. Field of the Invention

This invention concerns a plastic packaged device with a hollow portion enclosing a chip element, e.g., a semiconductor chip and a surface acoustic wave device, and concerns a method of manufacturing the same.

2. Description of the Prior Art

In the case where a surface acoustic wave device is packaged with a plastic material, it is necessary to form a hollow portion over the chip to allow for vibration of the surface acoustic wave device Conventionally, a construction of a plastic packaged device with a hollow portion and a method of manufacturing the same is known (see: Japanese laid open patent application No:60-53058).

FIGS. 1 and 2 show generally the construction and the method of the prior art. In the prior art, a blowing agent 14 diluted with ethanol is spread over a chip 10 mounted on a die pad portion 11 of a lead frame. The chip 10 is electrically connected to inner lead portions 12 with bonding wires 13. Next, the ethanol is volatilized, and a plastic packaging process is carried out. In this packaging process, the blowing agent 14 is blown off, and a hollow portion 27 is formed over the chip 10 (FIG. 2).

In the prior art, the die pad portion 11 is flat. Thus, to form a dome-shaped hollow portion, the blowing agent 14 is spread in a dome shape using the surface tension of the blowing agent. By expanding the blowing agent by application of a specific temperature during the packaging process, the dome-shaped hollow portion 27 is formed (FIG. 2).

However, in the case where the ratio of the area of the chip 10 to the die pad portion is high, it is difficult to cover the chip with the blowing agent with a sufficient thickness over the chip. Particularly, at the edge portions of the chip 10, the hollow portion becomes very narrow. To maintain the blowing agent at a sufficient thickness, the viscosity of the blowing agent can be increased. However, in this case, a large stress is applied to the bonding wires. This stress can harm the loop of the bonding wires, and sometimes causes a contact between the chip and the bonding wires. Furthermore, it is difficult to spread the blowing agent at a uniform thickness over the chip due to the high viscosity. Thus, it is difficult to get a desirable hollow portion. When the hollow portion is insufficient, and the inner wall contacts the chip, stress caused by contraction due to the heat cycle is applied to the chip during a reliability test. This causes a deterioration of the chip. The same problem occurs not only with the surface acoustic wave device, but also with other chips, such as semiconductor devices.

SUMMARY OF THE INVENTION

Therefore, an object of this invention is to provide a plastic packaged device having a large hollow portion over a chip for avoiding the application of thermal stress to the chip. Another object of his invention is to provide a method of manufacturing the improved plastic packaged device.

To achieve the above object, this invention provides a packaged electronic device, comprising: an electronic chip element; means for supporting the chip element; wall means defining an area therein for at least partially surrounding the chip element; and packaging means defining a hollow space at least partially within the area of the wall means for enclosing the chip element and separating the chip element from contact with the packaging means.

Furthermore, this invention provides a method of manufacturing a plastic packaged device, comprising the steps of: preparing a supporting member having a wall portion; bonding a chip element on the supporting member to surround the chip element at least partially by the wall portion: spreading a temporary covering material over the chip element; packaging the chip element with a packaging material; and removing the temporary covering material to form a hollow portion covering the chip element.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 1:
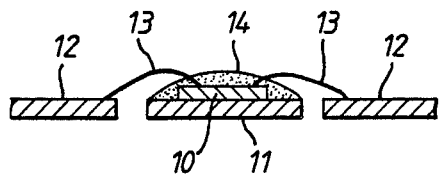
FIG.1 is a cross sectional view of a conventional plastic packaged device at the state when a blowing agent is spread over a chip element.
Figure 2:
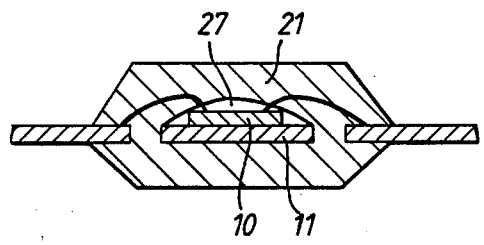
FIG. 2 is a cross sectional view of a conventional plastic packaged device having a hollow portion enclosing a chip element.
Figure 3:
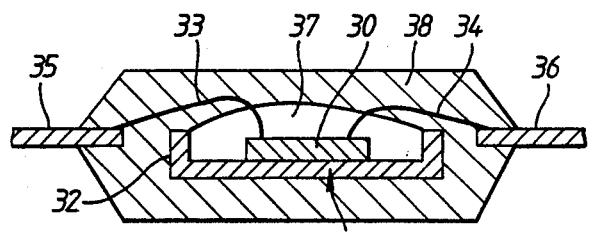
FIG. 3 is a cross sectional view of an embodiment of this invention.
Figure 4:
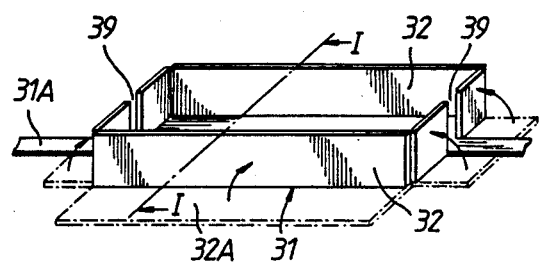
FIG. 4 is a perspective view of a die pad portion in accordance with this invention.

FIG. 3 is a cross sectional view of one embodiment of this invention. In FIG. 3, the packaged device comprises a chip element 30, e.g., a surface acoustic wave element, mounted on a die pad portion 31. The die pad portion 31 has a wall portion 32 formed at the periphery of the die pad portion 31 to surround the chip element 30. A numeral 37 designates a hollow portion to enclose the chip element 30. The chip element 30 is electrically connected to corresponding inner lead portions 35 and 36 with bonding wires 33 and 34. A numeral 38 designates a plastic package. It should be noted that the hollow portion 37 ends at the wall portion 32. In other words, the height at the edge portion of the hollow portion 37 with respect to the surface of the die pad portion 31 is relatively high. Namely, sufficient space for separating the chip element 30 from the plastic package is obtained.

Figure 5:
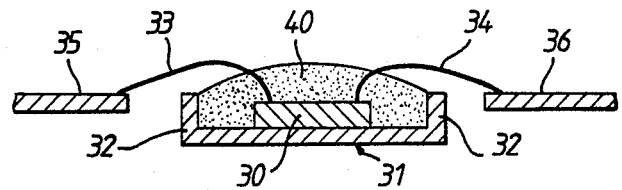
FIG. 5 is a cross sectional view showing the state when a blowing agent is spread over a chip element in accordance with this invention.

The packaged device is manufactured as follows. At first, a lead frame having a die pad portion 31 with the wall portion 32 is prepared. The wall portion 32 is formed, e.g., by bending the preformed side portions 32A by a press. It is of course possible to form the wall portion by a cut and bend process, simultaneously. As a spacer portion 31A for supporting the die pad portion 31 in the package (not shown) is necessary in the packaged device, there exists slit portions 39. The height of the wall portion 32 is selected to be approximately equal to or greater than the height of the chip element to be mounted on the die pad portion. It is preferable to depress the die pad portion 31 of the lead frame to coincide the surface of the chip element 30 with the surface of the inner leads 35 and 36 to allow an easy wire-bonding between the chip element 30 and the inner leads. FIG. 5 shows an embodiment where the die pad portion 31 is depressed.

Next, a chip element 30 is die bonded on the die pad portion 31, and wire-bonding is carried out to electrically connect the chip element 30 with the corresponding inner leads 35 and 36.

Next, a proper quality of a temporary covering material is spread over the chip element 30. For example, a blowing agent dispersed with ethanol, or a sublimating material such as wax, e.g., paraffin, is used as the temporary covering material. Now, the case using a blowing agent dispersed with ethanol is described as follows. When the blowing agent is spread, the leakage of the blowing agent through the slit 39 can be prevented due to the surface tension thereof if the width of the slit 39 is about 0.3 mm or less. Furthermore, the center portion of the blowing agent inflates due to the surface tension to form a dome-shape. Thus, sufficient thickness of the blowing agent is achieved at the mounting area of the chip element 30. Furthermore, in the vicinity of the wall portion 32, sufficient thickness of the blowing agent, at least the height of the wall portion 32, is achieved.

Next, a packaging step using, e.g., transfer mold process is carried out at about 175° C. In this step, as the starting point of the blowing of the blowing agent is below the mold temperature, the blowing of the blowing agent is carried out at the same time. Namely, the starting temperature of the blowing of the blowing agent, when an azobis.iso.butyro.nitride (AIBN) is used as the blowing agent, is 106°. After the blowing agent is removed, the hOllow portion 37 is formed.

In this way, by removing the blowing agent which covers the chip element temporarily with a sufficient thickness, a hollow portion of sufficient space is obtained. Therefore, a proper vibration of the surface acoustic saw device can be obtained. Furthermore, as sufficient thickness is obtained, it is not necessary to use a blowing agent of high viscosity. Thus, the stress on the bonding wires is reduced. Therefore, good loops of the bonding wires are achieved.

In the case where a sublimating material such as wax, e.g., paraffin, is used as the temporary covering material, the starting temperature of the sublimation is about 60°. Thus, the formation of the hollow portion is accomplished during the molding process, simultaneously.

Figure 6:
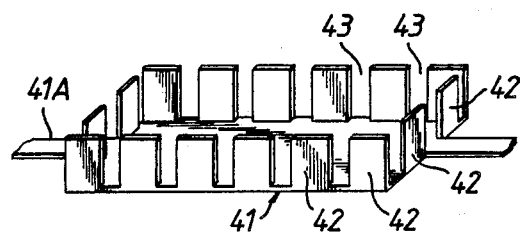
FIG. 6 is a perspective view of another embodiment of a die pad portion in accordance with this invention.

FIG. 6 shows another embodiment of this invention. In this embodiment, the wall portion 42 is formed intermittently with a plurality of slit portions 43. The all portions are also formed by bending the side portion of the die pad portion 41 by a press. In this embodiment, the bending step of the wall portion by the press is done relatively easily. Furthermore, the blowing agent is easily blown out through the plurality of slit portions 43 during formation of the hollow portion.

Figure 7:
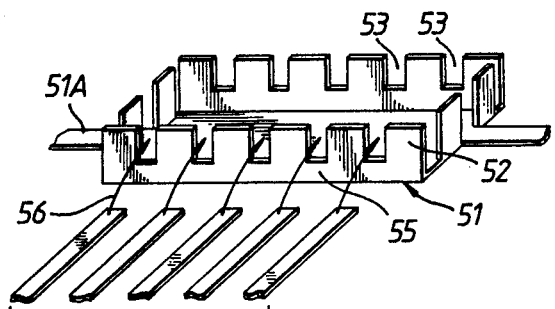
FIG. 7 is a perspective view of further embodiment of this invention, showing a die pad portion.

FIG. 7 shows a still further embodiment of this invention. In this embodiment, the slit portion 53 is formed shallower than the height of the wall portion 52. In other words, the wall portions 52 are connected by the connecting region 55. In this construction, the wall portion becomes more firm compared with the embodiment of FIG. 6. The wire bonding between the chip element (not shown) and the inner lead portion is carried out through the slit portions 53.

Figure 8:
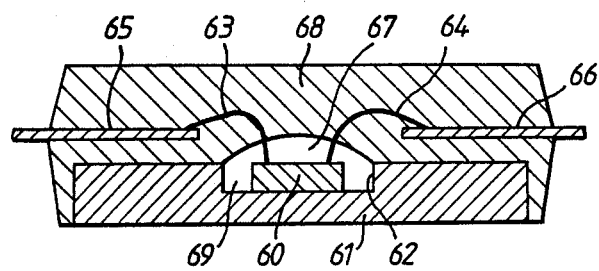
FIG. 8 is a still further embodiment of this invention, showing the die pad portion.

FIG. 8 shows a further embodiment of this invention. In this embodiment, a recess portion 69 is formed in the die pad portion 61. This recess portion 69 can be formed by press processing. The depressed portion 69 with a wall portion 62 allows the spread of a temporary covering material with sufficient thickness over the chip element 60. Thus, a hollow portion 67 having sufficient space is obtained. The chip element 60 is electrically connected to the inner leads 65 and 66 by bonding wires 63 and 64, and packaged with a plastic package 68.

Figure 9A:
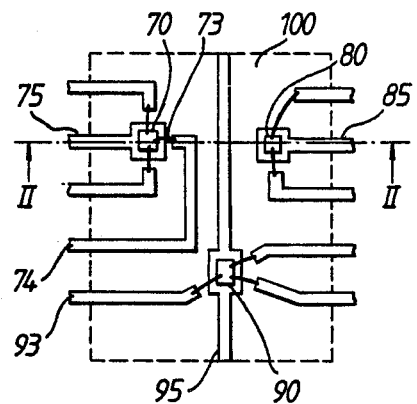
FIGS. 9A and 9B are a plan view and a cross sectional view of further embodiment of this invention.
Figure 9B:
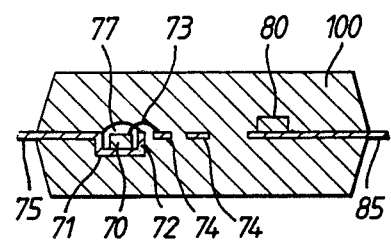

This invention is also applicable to a multi-chip type plastic packaged device, and at least one of the chips is required to be enclosed by a hollow portion. FIGS. 9A and 9B show an embodiment of a multi-chip type plastic packaged device, in which a plurality of chips 70, 80 and 90 are packaged. FIG. 9A is a plan view of the plastic packaged device. Each chip element 70, 80 and 90 is mounted on a respective die pad portion of leads 75, 85 and 95, and electrically connected to the corresponding inner leads with bonding wires. FIG. 9B is a cross sectional view of the packaged device of FIG. 9A taken along the line II-II. As is apparent from this drawing, the die portion 71 for supporting the chip 70 has a wall portion 72, and a hollow portion 77 is formed for covering the chip element 70.

Figure 10A:
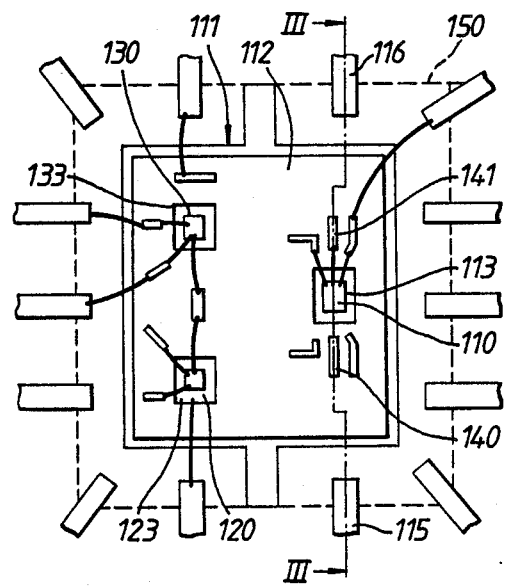
FIGS. 10A and 10B are a plan view and a cross sectional view of a still further embodiment of this invention.
Figure 10B:
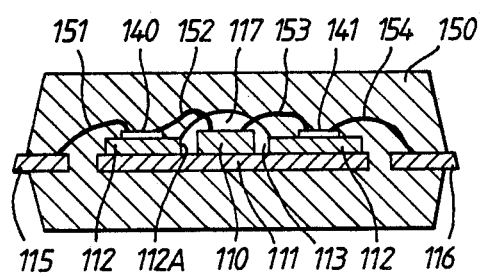

FIG. 10A and 10B show another embodiment of this invention. In this embodiment, a plurality of chip elements 110, 120 and 130 are mounted on a single die pad portion 111. FIG. 10A is a plan view of the plastic packaged device, and FIG. 10B is a cross sectional view taken along the line III-III of FIG. 10A.

In this embodiment, a printed circuit board 132 having a plurality of holes 113, 123 and 133 is fixed on the die pad portion 120. Each chip element is mounted in the corresponding hole. To simplify and make clear the drawing, some of the bonding wires are omitted. The chip element 110 is mounted on the die pad portion 111 at the center of the hole 113, and is packaged with a plastic package 150 with a hollow portion 117 covering the chip element with sufficient space. In this embodiment, as shown in FIG. 10B. the wall of the hole or the side wall of the printed circuit board 112 is used as the all for covering the chip element. The printed circuit board 112 is made of insulating material, e.g., ceramic of about 0.5 mm thick. The chip element 110 is electrically connected to the printed wires 140 and 141 with bonding wires 152 and 153, and further connected to the inner leads 115 and 116 through the printed wires 140 and 141 and bonding wires 161 and 154.

This invention is applicable to any type of plastic packaged device, such as Dual In-line-Packages (DIP), Flat Packages (FP), Quad Flat Packages (QFP), Plastic Leaded Chip Carriers (PLCC) and Single In-line Package devices.

The present invention has been described with respect to a specific embodiment. However, other embodiments based on the principles of the present invention should be obvious to those of ordinary skill in the art. Such embodiments are intended to be covered by the claims.

What is claimed is:

1. A packaged electronic device, comprising:
    an electronic chip element;
    means for supporting the chip element;
    packaging means for enclosed said chip element;
    wall means disposed on said supporting means for defining an area surrounding the electronic chip element; and
    said packaging means and said wall means defining a hollow space extending from said area and separating the chip element from contact with said packaging means.

2. The packaged device of claim 1, wherein the wall means comprises a plurality of wall) sections, each adjacent pair of wall sections having a slit portion therebetween.

3. The packaged device of claim 2, wherein the chip element has sides of a predetermined dimension, and the wall means includes walls extending from the supporting means for a distance approximately equal to the predetermined dimension.

4. The packaged device of claim 1, wherein the chip element is a surface acoustic wave device.

5. The packaged device of claim 1, wherein the packaged device has an outer surface, and the supporting means includes planar surface defining a part of the outer surface.

6. The packaged device of claim 1, wherein the wall means includes insulating material.

7. The packaged device of claim 6, wherein the insulating material includes a circuit board having wiring leads thereon, the leads being electrically connected to the chip element.

8. A packaged device containing a chip element mounted on a supporting member sealed within the device with a hollow portion over the chip element, characterized in that the supporting member includes wall portions which at least partially define the hollow portion.

9. The packaged device of claim 8, characterized in that the wall portion has a plurality of slit portions.

10. The packaged device of claim 9, also including wires connected through the slits to the chip element.

* * * * *